(12) United States Patent
Lee et al.

(10) Patent No.: US 7,474,154 B1
(45) Date of Patent: Jan. 6, 2009

(54) BIAS DEVICE CLAMPING CIRCUIT FOR FAST OVER-RANGE RECOVERY

(75) Inventors: Bumha Lee, Pleasanton, CA (US); David B. Barkin, San Francisco, CA (US); Sing W. Chin, Alameda, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 88 days.

(21) Appl. No.: 11/738,645

(22) Filed: Apr. 23, 2007

(51) Int. Cl.
*H03F 3/45* (2006.01)
(52) U.S. Cl. ..................................... 330/260
(58) Field of Classification Search .............. 330/253, 330/260
See application file for complete search history.

(56) References Cited

U.S. PATENT DOCUMENTS

| 4,623,786 | A | 11/1986 | Rodwell |
| 5,721,504 | A | 2/1998 | Sato |
| 6,005,438 | A | 12/1999 | Shing |
| 6,353,361 | B1 * | 3/2002 | Sun .......................... 330/253 |
| 6,642,795 | B2 | 11/2003 | Koen et al. |
| 6,750,712 | B1 | 6/2004 | Hoang |
| 6,897,731 | B2 | 5/2005 | Zhang et al. |
| 7,295,071 | B1 * | 11/2007 | Lee ............................ 330/258 |

OTHER PUBLICATIONS

Klaas Bult et al., "A Fast-Settling CMOS Op Amp for SC Circuits with 90-dB DC Gain," IEEE Journal of Solid-State Circuits, vol. 25, No. 6, Dec. 1990, pp. 1379-1384.

* cited by examiner

*Primary Examiner*—Steven J Mottola
(74) *Attorney, Agent, or Firm*—Patent Law Group LLP; Carmen C. Cook

(57) ABSTRACT

A gain-boosted telescopic amplifier (100) includes clamping circuits for the bias devices to ensure fast over-voltage recovery. In one embodiment, the gain-boosted telescopic amplifier includes an input pair of NMOS transistors ($M_{P1}$, $M_{N1}$), a pair of NMOS gain-boosted cascode transistors ($M_{P2}$, $M_{N2}$) and a pair of PMOS gain-boosted cascode transistors ($M_{P3}$, $M_{N3}$). The amplifier includes first and second clamping circuits driving the gate terminals of the pair of PMOS cascode transistors, respectively. The clamping circuits limit the gate voltage of the PMOS cascode transistors to be within a threshold voltage from the desired bias voltage. Each clamping circuit can include only a pull-down device, a pull-up device or both. In another embodiment, the amplifier includes clamping circuits driving the gate terminals of the pair of NMOS cascode transistors for limiting the gate voltage of the NMOS cascode transistors to be within a threshold voltage of the desired bias voltage.

13 Claims, 5 Drawing Sheets

BIAS DEVICE CLAMPING CIRCUIT FOR FAST OVER-RANGE RECOVERY

FIELD OF THE INVENTION

The invention relates to clamping circuit in amplifiers and, in particular, to a clamping circuit and a method for clamping the bias devices in an amplifier to allow fast recovery from an over-range condition.

DESCRIPTION OF THE RELATED ART

The demands for high performance and low power dissipation analog devices continuously increase in the communications and portable electronics applications. However designing high performance and low power analog devices is becoming more challenging. This is especially true for designing analog devices to realize a high DC voltage gain amplifier due to the lower output resistance (drain-to-source resistance) of the MOS transistors used to build analog devices. Deep sub-micron CMOS technologies are increasingly being used and the output resistance of MOS transistors fabricated using these technologies will keep decreasing because of the continuous device miniaturization mainly for higher operating frequency, lower manufacturing cost and power dissipation reduction and also for achieving a higher level of integration.

Operational amplifier is an important component determining overall analog circuit performance when it is used in a precise and high-speed gain block to implement a programmable/fixed gain amplifier and/or high resolution analog-to-digital converter (ADC). The bandwidth and DC voltage gain are the basic parameter specifications for the operational amplifier and also are very important for determining a suitable architecture for implementing the operational amplifier. Achieving higher DC voltage gain with single stage architecture is harder than achieving wider bandwidth in the recent deep sub-micron CMOS process, e.g. 0.25 μm or below. Therefore, a multistage amplifier is commonly adopted when high DC voltage gain is required. However, the power dissipation of these multistage amplifiers will not be minimal.

An over-voltage condition refers to situations where the amplifier input and/or output voltages reach higher than their normal operation range. When an over-voltage condition occurs, the bias voltages of the amplifier are shifted away from their original operating point and the amplifier can no longer perform according to the targeted specification. The recovery time of the amplifier refers to the time duration for the shifted bias point to return back to the original operating point after over-voltage condition is removed or return back to a certain bias point which is close enough to ensure that the circuit performance is acceptable. The recovery time for conventional amplifier is long because one and/or some of the devices in the amplifier become easily turned off completely or becomes biased in the sub-threshold region during the over-voltage condition.

When transistors in an amplifier are cascoded for larger output resistance, the equivalent channel length of the cascoded device bias voltage generator device is not short, but quite long to generate a larger gate-to-source voltage than that of the bias generator transistor for the current source. Even though the cascode device are not in completely off or sub-threshold region during the over-voltage condition, the time constant (τ) of the cascode bias circuit recovery is longer than other bias points mostly due to the small transconductance of the cascode device and the heavy capacitive load. More specifically, the time constant τ is given as:

$$\tau = \frac{C_{total}}{g_m}.$$

where $g_m$ is the transconductance of the bias voltage generator. Generally, the bias voltage generator is a diode-connected MOS device, and $C_{total}$ is the total capacitive load on the bias node.

If the recovery time is long, the amplifier circuit would malfunction until the bias point recovers back to the original point from the shifted point. A long recovery time in an amplifier circuit is thus undesirable.

The over-voltage recovery problem is described with reference to a gain-boosted telescopic amplifier. When the gain-boosted telescopic amplifier suffers from an over-voltage condition, the bias point of the cascode transistor of the amplifier can become shifted more than its tolerant range. As a result, even after the over-voltage condition is removed, the amplifier cannot perform as targeted until it recovers completely.

A telescopic amplifier is widely used in switched-capacitor circuit area because its input and output common modes can be precisely controlled. Gain-boosted telescopic amplifiers have many merits over other architectures. For instance, a gain-boosted telescopic amplifier consumes minimal power among class-A amplifiers, and has the widest bandwidth with a given loading condition. Furthermore, the telescopic amplifier's input equivalent noise is the lowest due to fewer devices on signal path. On the other hand, its application is limited due to the narrow input common range. Designing a high DC gain amplifier is difficult without cascading transistors on signal path or using a gain-boosting technique, both methods reducing the available output swing with a given supply voltage. Cascoding more than two transistors on each power (VDD and GND) to increase output impedance is not acceptable in low supply voltage design because it reduces output range dramatically and then the sampling capacitor size must be increased proportionally in square in order to compensate the output range loss in order to maintain the target signal-to-noise ratio (SNR) target.

For lower power dissipation and lower amplifier noise, telescopic amplifier is adapted in many high performance analog designs aided by a gain-boosting technique to achieve high DC voltage gain. The details of a conventional gain-boosted telescopic amplifier is described in K. Bult, G. Geelen, "A Fast-Settling CMOS Op Amp for SC Circuits with 90-dB DC Gain", IEEE J. Solid-State Circuits, Vol. 25, No. 6, pp. 1379-1384, December 1990. The detail design criteria for a conventional gain-boosted telescopic amplifier is described in detail in the Bult paper and will not be further addressed.

FIG. 1 is the circuit diagram of a conventional fully differential gain-boosted telescopic amplifier. In the present description, the following device notations are used. A subscript "P" in the device name means that the device is in the positive signal path, while a subscript "N" in the device name means that the device is in the negative signal path of the amplifier. Referring to FIG. 1, NMOS transistors $M_{P1}$ and $M_{N1}$ form the input pair of a gain-boosted telescope amplifier 10 ("amplifier 10"). NMOS transistors are used for the input pair for wider bandwidth and also smaller parasitic capacitance. The output equivalent impedance of amplifier 10 is increased by adding four gain-boosting amplifiers: amplifiers $AMP_{P1}$ and $AMP_{N1}$ with NMOS cascode devices $M_{P2}, M_{N2}$), respectively; and amplifiers $AMP_{P2}$ and $AMP_{N2}$ with PMOS cascode devices $M_{P3}$ and $M_{N3}$, respectively. Current $I_P$, current $I_N$ and current $I_{TAIL}$ set the bias current of the amplifier.

Voltages $V_{CSN}$ and $V_{CSP}$ are bias voltages for the NMOS cascode transistors $M_{P2}$ and $M_{N2}$ and the PMOS cascode transistors $M_{P3}$ and $M_{N3}$, respectively. The bias voltages are tightly controlled to maximize the output range with maintaining a marginal bias point for the current sources providing currents $I_P$ and $I_N$ and also the input devices $M_{P1}$, $M_{N1}$. Common mode feedback (CMFB) loop for the output common mode control is omitted for simplicity. For instance, a switched capacitor type CMFB circuit can be used.

The amplifier is under an over-voltage condition when the amplifier output voltage is much higher than its normal operation range, such as when the output voltages $V_{OUTP}$ and $V_{OUTN}$ are in the vicinity of the $V_{DD}$ voltage and ground respectively, while amplifier 10 is configured in amplification mode with a capacitive feedback network. Due to this over-voltage condition at the output voltages, PMOS cascode transistor $M_{N3}$ is turned off completely and the source node 12 of PMOS transistor $M_{N3}$ moves toward the $V_{DD}$ voltage in order to turn off the current source providing current $I_N$. Gain-boosting amplifier $AMP_{N2}$ connected to PMOS transistor $M_{N3}$ then amplifies the voltage difference at its input terminals by the amount of its DC voltage gain. Because the voltage difference between the $V_{DD}$ voltage and the bias voltage $V_{CSP}$ is large, the gate terminal of cascode PMOS cascode transistor $M_{N3}$ is quickly driven down to the ground voltage. The gain-boosting feedback loop consisting of transistor $M_{N3}$ and amplifier $AMP_{N2}$ is disabled and not properly operating since no current is following through transistor $M_{N3}$, and the gate voltage of PMOS transistor $M_{N3}$ remains at a low voltage level.

For amplifier 10, after the over-voltage condition is removed, the amplifier takes a long time to recover back to the original biasing point due to current starving through PMOS transistor $M_{N3}$ as well as low speed of amplifier $AMP_{N2}$. In amplifier 10, the PMOS cascode transistors are out of the signal path and therefore the gain-boosting loops including amplifiers $AMP_{P2}$ and $AMP_{N2}$ and PMOS transistors $M_{P3}$, $M_{N3}$ are designed to be slow for low power dissipation and also easier stability control for low power dissipation and a more stable control loop. The recovery time of the PMOS cascode transistor $M_{N3}$ and the gain-boosting amplifier $AMP_{N2}$ can easily take longer than one clock cycle at high operating rate. While the gain-boosting feedback loop recovers, PMOS transistor $M_{N3}$ is at a wrong biasing point which deteriorates the circuit performance during the next coming operation periods even though the input and/or output voltage levels of amplifier 10 are both within the normal operating range. The long recovery time is caused by amplifier DC gain drop, reduced bandwidth, shifted output and input common mode levels and no stable feedback loop around the PMOS cascode transistor $M_{N3}$.

FIG. 2 illustrates voltage waveforms of amplifier 10 as a result of an over-voltage condition at the output voltages. At clock phase 1 (clock 1), the output voltages of amplifier 10 experience an over-voltage condition and the voltage difference is much larger than the normal output range. As a result of the over-range condition, the gate voltage of transistor $M_{N3}$ is forced downed rapidly and the voltage cannot completely recover to the original bias point even after the clock reset phase which is the low phase of the clock. During the amplifier reset phase, the amplifier input terminals are connected to their original bias voltage—the input common mode and the amplifier output terminals are tied together to eliminate any memory effect on the output common mode level and also to reduce amplifier output swing during the following amplification phase which is the high phase of the clock.

At clock phase 2 (clock 2), even though the differential voltage at the amplifier output is within the normal operating range, it is off from the targeted voltage due to PMOS cascode transistor $M_{N3}$ having its bias point shifted down as shown by the dotted circuit in FIG. 2. The gate voltage of PMOS cascode transistor $M_{P3}$ is not noticeably affected even with the over-voltage condition because there is enough bias current through PMOS cascode transistor $M_{P3}$ and the gain-boosting loop is kept alive. NMOS cascode transistor $M_{P2}$ and gain-boosting amplifier $AMP_{P1}$ will have exactly the same behavior as transistor $M_{N3}$ and amplifier $AMP_{N2}$ but with opposite polarity.

For instance, in one application, the targeted differential output voltage ($V_{OUTP}$-$V_{OUTN}$) after the over-voltage condition is removed is −500.8 mV. For amplifier 10, the differential output voltage is only −467.8 mV which is off by 66 least significant bit (LSB) with a 2Vp-p 12 bit ADC (analog-to-digital converter). This output voltage error is mainly caused by the lower DC voltage gain while PMOS cascode transistor $M_{N3}$ is sitting in the triode region rather than in the saturation region.

To reduce the bias point recovery time, the bias current of the gain-booting amplifier can be increased for shorter slewing time. However, this solution will increase the total power dissipation of the amplifier without any advantage on the operating speed. Furthermore, while the amplifier is working under the normal operation condition, the increased bias current makes it harder to stabilize the gain-boosting loop. When some of the devices in the gain-boosting feedback loop of the amplifier are completely turned off, the circuit recovery time varies a lot and also it is not easy to predict precisely. Due to the above reasons, conventional gain-boosting telescopic amplifiers suffer from unpredictable and unexpectedly long bias recovery time.

BRIEF DESCRIPTION OF THE DRAWINGS

FIG. 2, which includes

FIG. 4, which includes

DETAILED DESCRIPTION OF THE PREFERRED EMBODIMENTS

In accordance with the principles of the present invention, a gain-boosting telescopic amplifier includes a clamping circuit coupled to the bias devices of the amplifier to allow fast recovery from an over-voltage condition. The clamping circuit keeps the bias voltage of the bias devices close to the original biasing point even under an over-voltage condition. Thus, the bias devices will not get turned off during an over-voltage condition. As a result, the recovery time from an over-voltage condition is short enough so as not to adversely impact circuit performance after the over-voltage condition is removed.

More specifically, the clamping circuit is activated only when an over-voltage condition occurs in the amplifier. Hence, there is no additional power dissipation and also no performance degradation during the normal operation of the amplifier. The clamping circuit is capable of dramatically reducing the recovery time of the amplifier biasing point after the over-voltage condition is removed. In accordance with the present invention, the clamping circuit uses an open loop approach instead of a closed loop one for faster response and more stable operation. The clamping circuit and method can be applied to other similar circuit conditions for maintaining a desired voltage level at a node.

Figure 3:
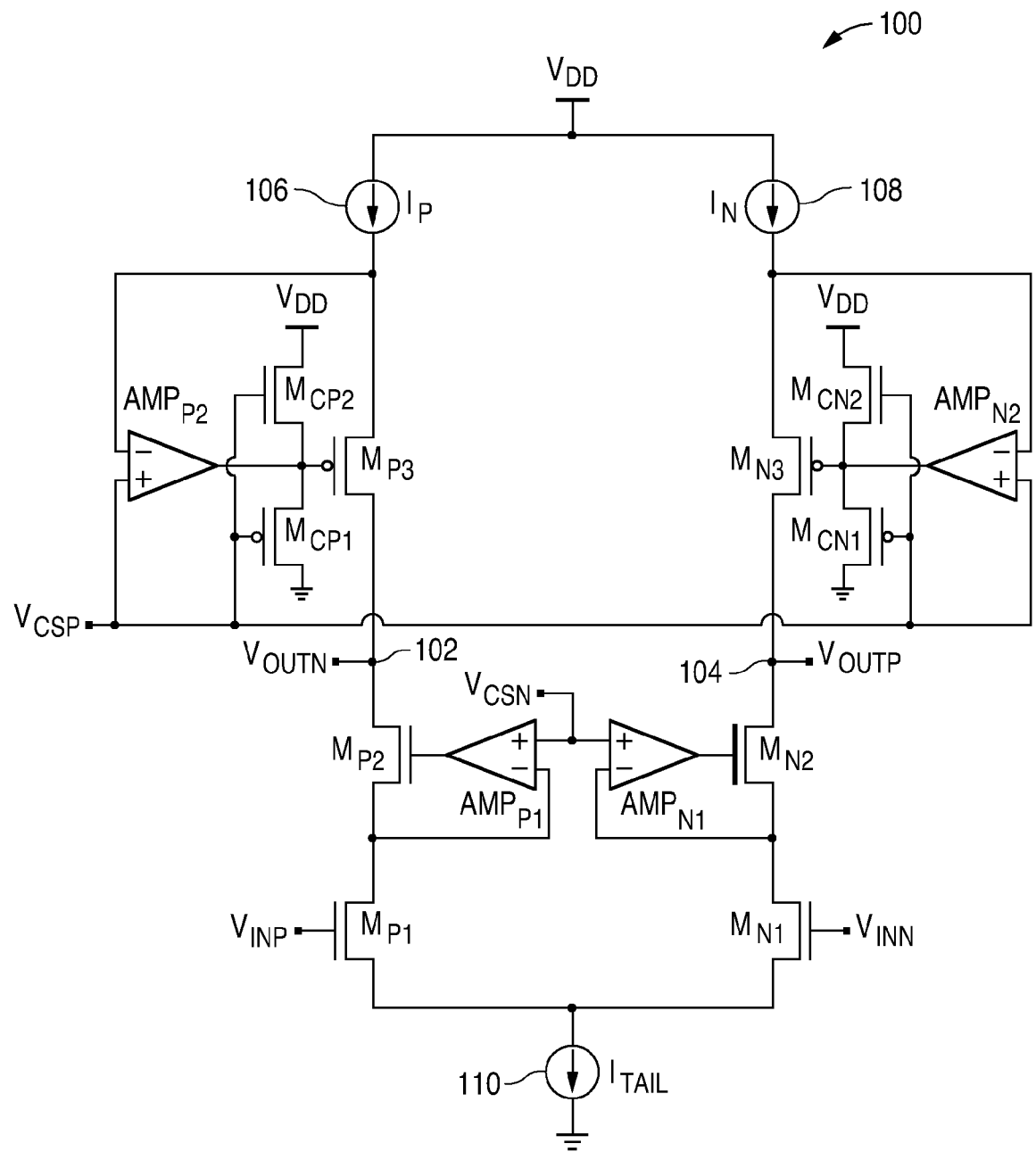
FIG. 3 is a circuit diagram of a fully differential gain-boosted telescopic amplifier incorporating a pair of clamping circuits according to one embodiment of the present invention.

FIG. 3 is a circuit diagram of a fully differential gain-boosted telescopic amplifier incorporating a pair of clamping circuits according to one embodiment of the present invention. Referring to FIG. 3, a gain-boost telescopic amplifier 100 receives a pair of differential input signals $V_{INP}$ and $V_{INN}$ on its differential input terminals and provides a pair of differential output signals $V_{OUTN}$ and $V_{OUTP}$ on output nodes 102 and 104. Amplifier 100 includes NMOS transistors $M_{P1}$ and $M_{N1}$ forming the input pair of the amplifier. The input signals $V_{INP}$ and $V_{INN}$ are coupled to NMOS transistors $M_{P1}$ and $M_{N1}$, respectively.

In amplifier 100, four gain-boosting amplifiers coupled to four cascode transistors are used to achieve high DC voltage gain while maintaining wide output swing. Specifically, amplifiers $AMP_{P1}$ and $AMP_{N1}$ are coupled to NMOS cascode transistors $M_{P2}$ and $M_{N2}$, respectively, while amplifiers $AMP_{P2}$ and $AMP_{N2}$ are coupled to PMOS cascode transistors $M_{P3}$ and $M_{N3}$, respectively. Amplifiers $AMP_{P1}$ and $AMP_{N1}$ receive a bias voltage $V_{CSN}$ for biasing NMOS cascode transistors $M_{P2}$ and $M_{N2}$ at their desired bias point. Amplifiers $AMP_{P2}$ and $AMP_{N2}$ receive a bias voltage $V_{CSP}$ for biasing PMOS cascode transistors $M_{P3}$ and $M_{N3}$ at their desired bias point.

Current sources 106 and 108, providing currents $I_P$ and $I_N$, respectively, function as the current load for the respective input pair transistors $M_{P1}$ and $M_{N1}$. A current source 110 provides a tail current $I_{TAIL}$ for the common source node of the input pair $M_{P1}$ and $M_{N1}$.

Figure 1:
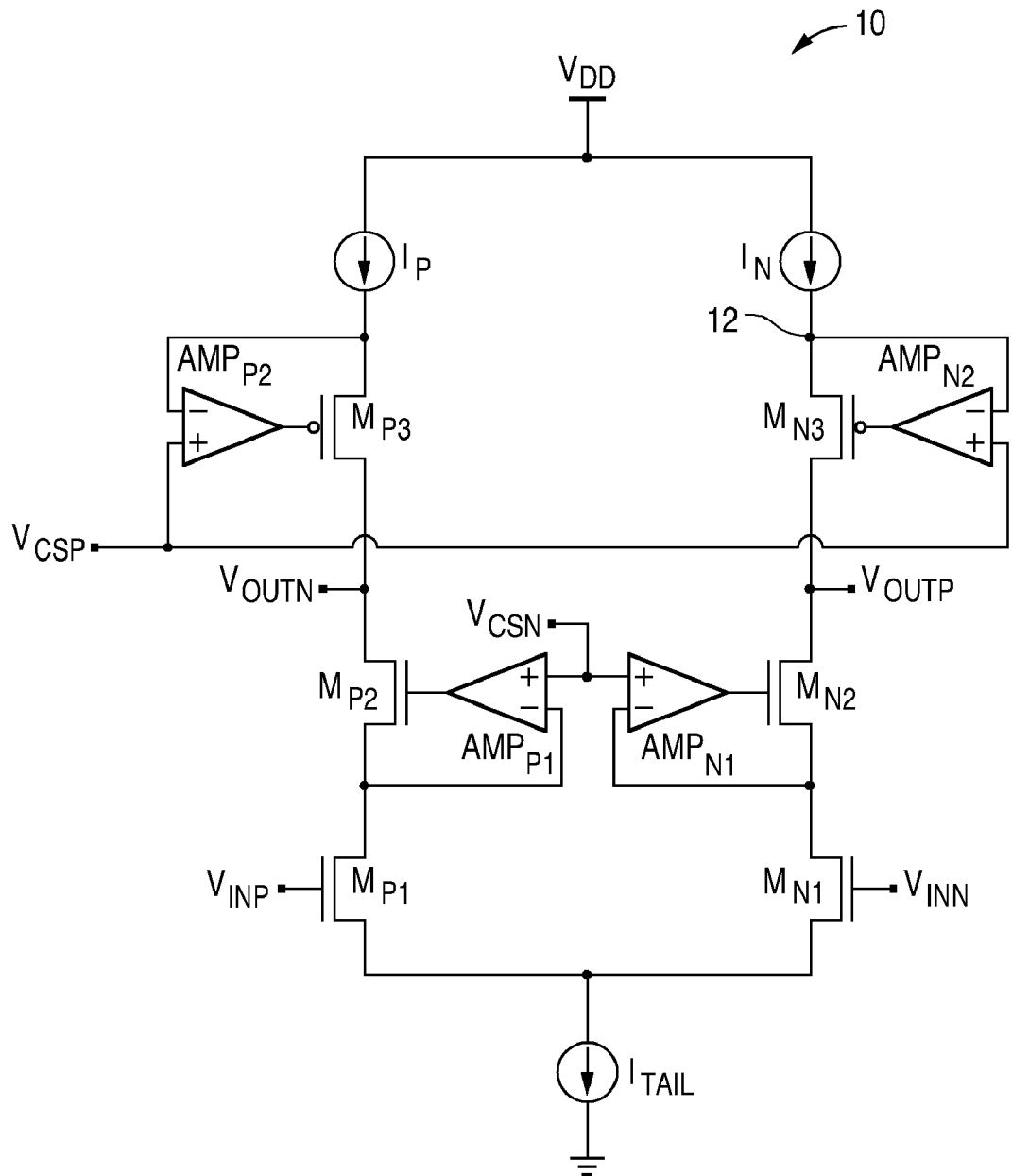
FIG. 1 is the circuit diagram of a conventional fully differential gain-boosted telescopic amplifier.
Figure 2A:
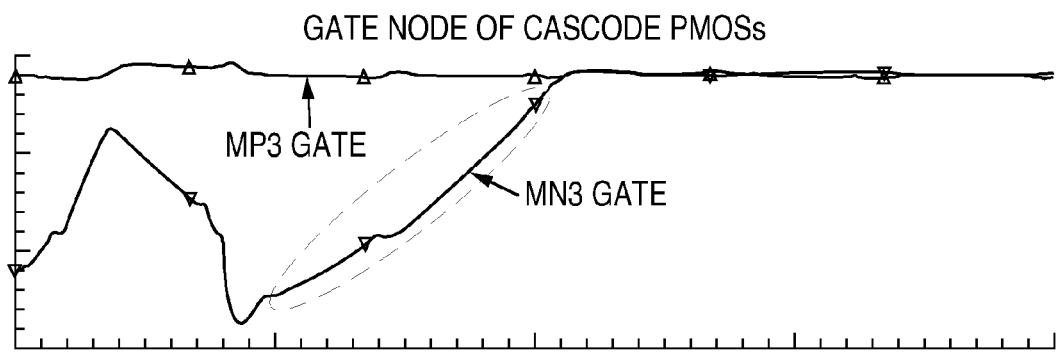
FIGS. 2A, 2B and 2C, illustrates voltage waveforms of the amplifier of FIG. 1 as a result of an over-voltage condition at the output voltages.
Figure 2B:
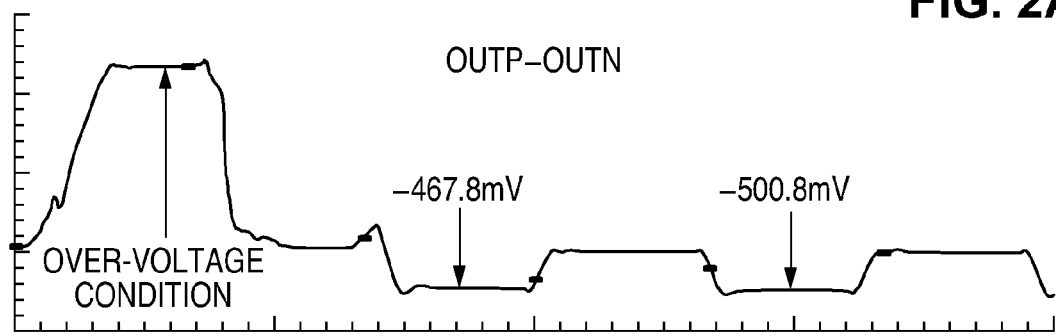
Figure 2C:
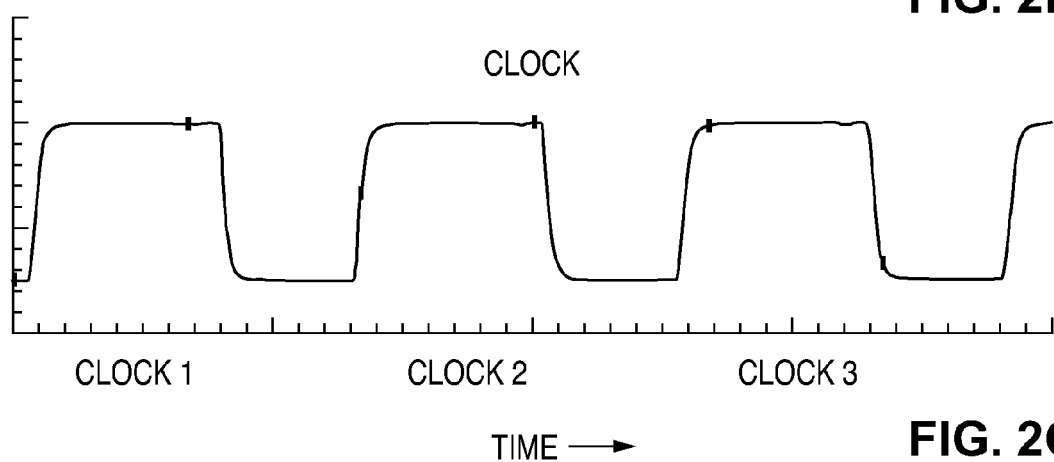

When an over-voltage condition is introduced on the amplifier output nodes, the bias point of the PMOS cascode transistors $M_{P3}$ and $M_{N3}$ are shifted away from the original bias point as explained above with reference to FIG. 1. When the bias point of the PMOS cascode transistors $M_{P3}$ and $M_{N3}$ are shifted too far from the intended bias point, the performance of the amplifier during the following clock phases is adversely affected even after the over-voltage condition is removed. In accordance with the present invention, a pair of clamping circuits is incorporated in amplifier 100 to hold the bias point of the PMOS cascode transistors $M_{P3}$ and $M_{N3}$ to be about the intended point. In this manner, a fast recovery time from an over-voltage condition can be realized and amplifier 100 can return to normal operation as soon as the over-voltage event expires.

Referring to FIG. 3, amplifier 100 includes a first clamping circuit for PMOS cascode transistor $M_{P3}$ formed by an NMOS transistor $M_{CP2}$ and a PMOS transistor $M_{CP1}$, connected in series between the $V_{DD}$ voltage and the ground voltage. The gate terminals of the clamping transistors $M_{CP2}$ and $M_{CP1}$ are driven by the bias voltage $V_{CSP}$. The common node between transistors $M_{CP2}$ and $M_{CP1}$ is coupled to the gate terminal of PMOS cascode transistor $M_{P3}$.

Amplifier 100 further includes a second clamping circuit for PMOS cascode transistor $M_{N3}$ formed by an NMOS transistor $M_{CN2}$ and a PMOS transistor $M_{CN1}$, connected in series between the $V_{DD}$ voltage and the ground voltage. The gate terminals of the clamping transistors $M_{CN2}$ and $M_{CN1}$ are driven by the bias voltage $V_{CSP}$. The common node between transistors $M_{CN2}$ and $M_{CN1}$ is coupled to the gate terminal of PMOS cascode transistor $M_{N3}$.

The addition of the first and second clamping circuits does not affect the amplifier circuit performance under normal operating condition. More specifically the clamping circuits are disabled and no current flows through the clamping transistors when amplifier 100 is within normal operating condition and are activated only while an over-voltage condition occurs at the amplifier output voltages.

The operation of the second clamping circuit is described. It is understood that the first clamping circuit operates in the same manner as the second clamping circuit and will not be further described in detail. When output voltage $V_{OUTP}$ (node 104) goes above the normal operating range, the gate voltage of PMOS cascode transistor $M_{N3}$ moves down enough to turn on NMOS transistor $M_{CN2}$. As a result, the gate voltage of transistor $M_{N3}$ is clamped at a voltage of $V_{CSP}-V_{THN}$, where voltage $V_{THN}$ denotes the threshold voltage of NMOS transistor $M_{CN2}$, instead of moving down to the ground voltage. The gate voltage of transistor $M_{N3}$ is clamped until the over-voltage condition is removed. The AC transient current for sustaining the clamped voltage is provided by the power supply voltage $V_{DD}$ rather than any internal bias current cell for faster response and stronger driving capability.

On the other hand, when the output voltage $V_{OUTP}$ goes down enough to shift the gate voltage of PMOS cascode transistor $M_{N3}$ high toward to the power supply voltage $V_{DD}$, PMOS transistor $M_{CN1}$ turns on to prevent the gate voltage of PMOS cascode transistor $M_{N3}$ from moving up to the power supply $V_{DD}$ voltage. More specifically, MOS transistor $M_{CN1}$ turns on to clamp the gate voltage of PMOS cascode transistor $M_{N3}$ to a voltage of $V_{CSP}+V_{THP}$, where voltage $V_{THP}$ denotes the threshold voltage of PMOS transistor $M_{CN1}$.

The four clamping transistors $M_{CP1}$, $M_{CP2}$, $M_{CN1}$ and $M_{CN2}$ are turned off during normal operating condition of amplifier 100 and therefore no additional power dissipation is incurred. The first and second clamping circuits effectively limit the gate voltages of cascode transistors $M_{P3}$ and $M_{N3}$ to be within the voltage margin of threshold voltages $V_{THN}$ and $V_{THP}$ from the bias voltage $V_{CSP}$. The gain-boosting loop speed and stability are minimally affected since the additional parasitic capacitance introduced by the junction capacitances of the clamping transistors $M_{CP1}$, $M_{CP2}$, $M_{CN1}$ and $M_{CN2}$ on the gain-booting amplifier output nodes is negligibly small compare to the gate capacitance of PMOS cascode transistors $M_{P3}$ and $M_{N3}$.

The gate voltages of the PMOS clamping transistors ($M_{CP1}$ and $M_{CN1}$) can be adjusted up from the bias voltage $V_{CSP}$ to be less than the threshold voltage $V_{THP}$ for faster recovery. However, it is important to ensure that PMOS clamping transistors $M_{CP1}$ and $M_{CN1}$ are completely off during the normal amplifier operation, after device mismatches and sub-threshold operation of the clamping transistors are taken into consideration. The clamping transistors are turned off during normal amplifier operation to avoid forming a stray current path through the clamping transistors which can reduce the gain-boosting loop gain and this consequently reduces the overall amplifier DC voltage gain.

The gate voltages of NMOS clamping transistors $M_{CP2}$ and $M_{CN2}$ gate voltages can be adjusted in same manner as the PMOS clamping transistors except with opposite polarity.

The clamping transistors do not need to be large because they work as source follower when clamping is on. A longer than minimum channel length transistor can be used to reduce threshold voltage of the clamping devices when the CMOS fabrication process has strong reverse short channel effect on the threshold voltage.

In accordance with the present invention, the clamping method for fast over-range recovery is an open loop scheme so that the recovery time is extremely short and there is no stability issue. If a close loop scheme, such as a feedback loop, is used to reduce the recovery time, loop stability would be a concern. Furthermore, the clamping circuits do not generate additional power dissipation and the increment of die area to implement the clamping circuits is minimal. The AC current through the clamping transistors is provided by power supply rather than any other current source so that fast response can be achieved. Lastly, the clamping circuits do not affect the amplifier biasing at all.

In the above-described embodiment, the first and second clamping circuits each includes a PMOS clamping transistor as a pull-down device and an NMOS clamping transistor as a pull-up device. In an alternate embodiment, the first and second clamping circuits are implemented using only the pull-up devices (the NMOS clamping transistors). An NMOS-only implementation is appropriate when the recovery time of the PMOS cascode transistors $M_{P3}$ and $M_{N3}$ from a higher voltage to the original bias point is short enough so that a pull-down device is not needed. In yet another embodiment, the first and second clamping circuits are implemented using only the pull-down devices (the PMOS clamping transistors). A PMOS-only implementation is appropriate when the recovery time of the PMOS cascode transistors $M_{P3}$ and $M_{N3}$ from a lower voltage to the original bias point is short enough so that a pull-up clamping transistor is not needed.

Figure 4A:
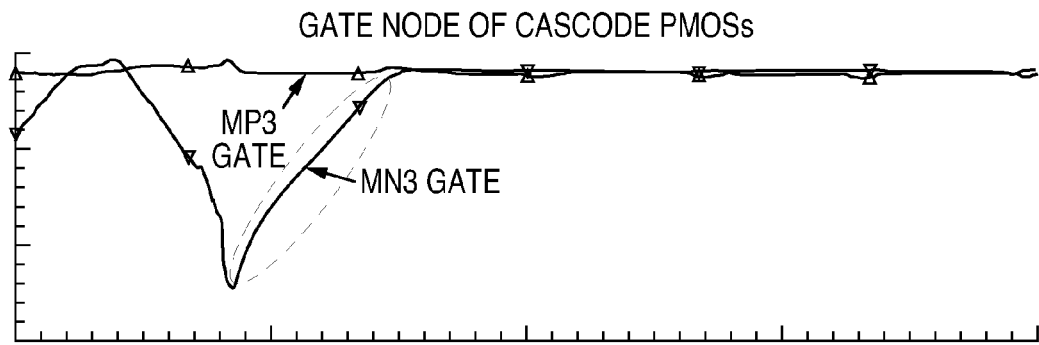
FIGS. 4A, 4B and 4C, illustrates the voltage waveforms of the amplifier of FIG. 3 as a result of an over-voltage condition at the output voltages.
Figure 4B:
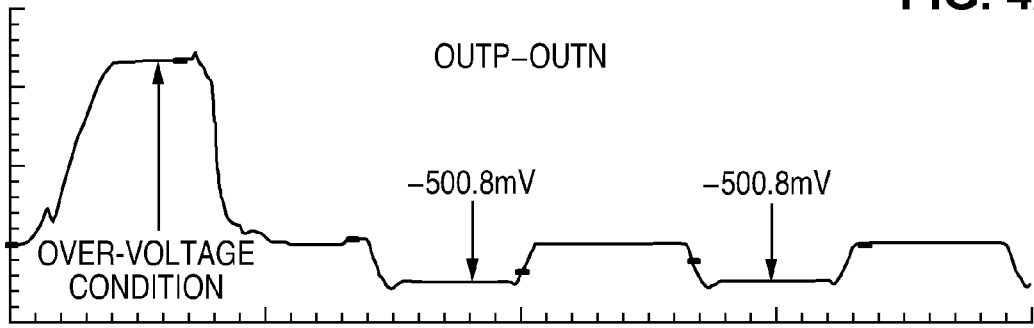
Figure 4C:
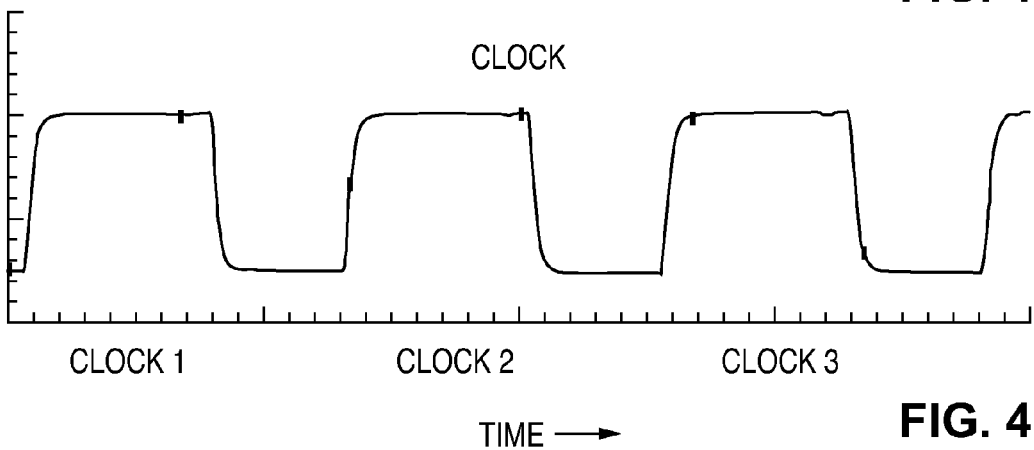

FIG. 4 illustrates the voltage waveforms of the amplifier of FIG. 3 as a result of an over-voltage condition at the output voltages. At clock phase 1 (clock 1), the output voltages of amplifier 10 experience an over-voltage condition and the voltage difference is much larger than the normal output range. As a result of the over-range condition, the gate voltage of transistor $M_{N3}$ is forced downed rapidly. However, the gate voltage of transistor $M_{N3}$ quickly moves back toward the intended bias point with the aid of NMOS clamping transistor $M_{CN2}$, as shown by the dotted circle in FIG. 4. By the end of the low phase of the clock period, the gate voltage of PMOS cascode transistor $M_{N3}$ has completely recovered.

At clock phase 2 (clock 2), right after the over-voltage condition is removed, the differential output voltage becomes immediately −500.8 mV which is the targeted value. Because amplifier 100 can recover immediately at the next clock phase, the over-voltage condition does not affect the circuit performance during the subsequent operation. The recovery time of amplifier 100 can be further shortened by increasing the device size of the clamping transistors.

Figure 5:
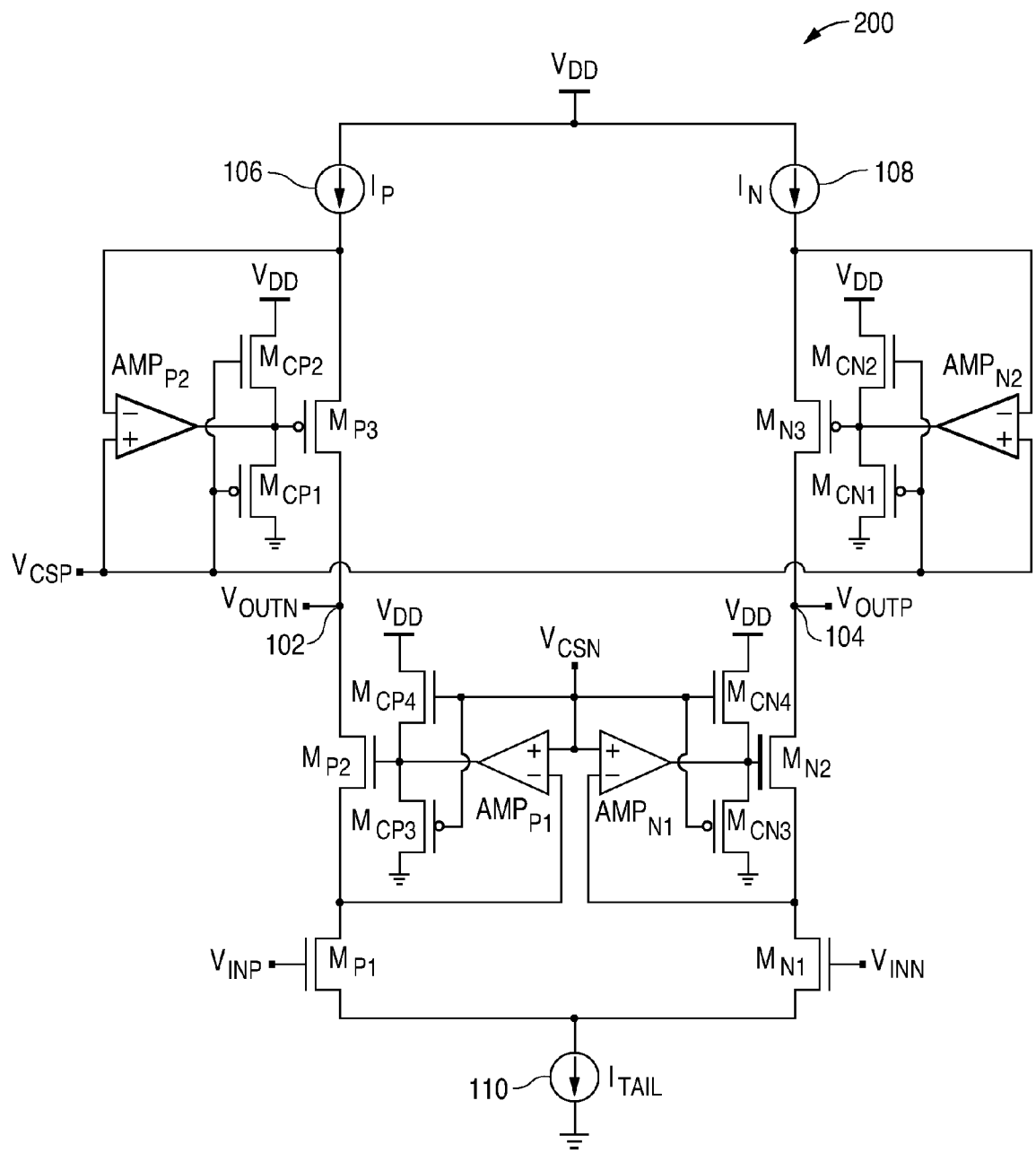
FIG. 5 is a circuit diagram of a fully differential gain-boosted telescopic amplifier incorporating two pairs of clamping circuits according to an alternate embodiment of the present invention.

In the above description, the clamping circuits are applied only to the PMOS cascode transistors. According to an alternate embodiment of the present invention, the clamping circuits can also be applied to the NMOS cascode transistors $M_{P2}$ and $M_{N2}$, as shown in FIG. 5. The third and fourth clamping circuits coupled to NMOS transistor $M_{P2}$ and $M_{N2}$, respectively, operate in the same manner to effectively limit the gate voltages of cascode transistors $M_{P2}$ and $M_{N2}$ to be within the voltage margin of threshold voltages $V_{THN}$ and $V_{THP}$ about the bias voltage $V_{CSN}$. Furthermore, the clamping circuits for the NMOS cascode transistors can be formed with just the NMOS clamping transistors, just the PMOS clamping transistors, or both.

The above detailed descriptions are provided to illustrate specific embodiments of the present invention and are not intended to be limiting. Numerous modifications and variations within the scope of the present invention are possible. The present invention is defined by the appended claims.

We claim:

1. A gain-boosted telescopic amplifier (100), comprising:
   first and second NMOS transistors ($M_{P1}$, $M_{N1}$) forming an input pair for receiving a pair of differential input signals ($V_{INP}$, $V_{INN}$), the first and second NMOS transistors having source terminals coupled to a tail current source (110);
   first and second NMOS cascode transistors ($M_{P2}$, $M_{N2}$), each NMOS cascode transistor being coupled between a respective input pair transistor and a respective output node (102, 104), each NMOS cascode transistor being configured in a gain-boosting feedback loop with an amplifier ($AMP_{P1}$, $AMP_{N1}$) and being driven to a first bias voltage ($V_{CSN}$);
   first and second PMOS cascode transistors ($M_{P3}$, $M_{N3}$) comprising a first, each PMOS cascode transistor being coupled between a respective output node (102, 104) and a respective bias current source (106, 108), each PMOS cascode transistor being configured in a gain-boosting feedback loop with an amplifier ($AMP_{P2}$, $AMP_{N2}$) and being driven to a second bias voltage ($V_{CSP}$);
   a first clamping circuit coupled between the gate terminal of the first PMOS cascode transistor and a power supply voltage and being driven by the second bias voltage, the first clamping circuit limiting the gate voltage of the first PMOS cascode transistor to be within a threshold voltage of the second bias voltage; and
   a second clamping circuit coupled between the gate terminal of the second PMOS cascode transistor and a power supply voltage, the second clamping circuit limiting the gate voltage of the second PMOS cascode transistor to be within a threshold voltage of the second bias voltage,
   wherein the output nodes coupled to the pair of gain-boosted NMOS cascode transistors provides differential output voltages ($V_{OUTN}$, $V_{OUTP}$).

2. The gain-boosted telescopic amplifier of claim 1, wherein:
   the first clamping circuit comprises a third NMOS transistor ($M_{CP2}$) having a drain terminal coupled to a positive power supply voltage, a source terminal coupled to the gate terminal of the first PMOS cascode transistor ($M_{P3}$) and a gate terminal coupled to the second bias voltage ($V_{CSP}$); and
   the second clamping circuit comprises a fourth NMOS transistor ($M_{CN2}$) having a drain terminal coupled to the positive power supply voltage, a source terminal coupled to the gate terminal of the second PMOS cascode transistor ($M_{N3}$) and a gate terminal coupled to the second bias voltage ($V_{CSP}$),
   wherein the first and second clamping circuits limit the gate voltage of the first and second PMOS cascode transistors to a voltage of $V_{CSP}-V_{THN}$, where $V_{CSP}$ denotes the second bias voltage and $V_{THN}$ denotes the threshold voltage of the NMOS transistors.

3. The gain-boosted telescopic amplifier of claim 1, wherein:
   the first clamping circuit comprises a first PMOS transistor ($M_{CP1}$) having a drain terminal coupled to a negative power supply voltage, a source terminal coupled to the gate terminal of the first PMOS cascode transistor ($M_{P3}$) and a gate terminal coupled to the second bias voltage ($V_{CSP}$); and the second clamping circuit comprises a second PMOS transistor ($M_{CN1}$) having a drain terminal coupled to the negative power supply voltage, a source terminal coupled to the gate terminal of the second PMOS cascode transistor ($M_{N3}$) and a gate terminal coupled to the second bias voltage ($V_{CSP}$), wherein the first and second clamping circuits limit the gate voltage of the first and second PMOS cascode transistors to a voltage of $V_{CSP}+V_{THP}$, where $V_{CSP}$ denotes the second bias voltage and $V_{THP}$ denotes the threshold voltage of the PMOS transistors.

4. The gain-boosted telescopic amplifier of claim 2, wherein:

the first clamping circuit further comprises a first PMOS transistor ($M_{CP1}$) having a drain terminal coupled to a negative power supply voltage, a source terminal coupled to the gate terminal of the first PMOS cascode transistor ($M_{P3}$) and a gate terminal coupled to the second bias voltage ($V_{CSP}$); and the second clamping circuit further comprises a second PMOS transistor ($M_{CN1}$) having a drain terminal coupled to the negative power supply voltage, a source terminal coupled to the gate terminal of the second PMOS cascode transistor ($M_{N3}$) and a gate terminal coupled to the second bias voltage ($V_{CSP}$), wherein the first and second clamping circuits further limit the gate voltage of the first and second PMOS cascode transistors to a voltage of $V_{CSP}+V_{THP}$, where $V_{THP}$ denotes the threshold voltage of the PMOS transistors.

5. The gain-boosted telescopic amplifier of claim 4, wherein the positive power supply voltage comprises a $V_{DD}$ voltage and the negative power supply voltage comprises a ground voltage.

6. The gain-boosted telescopic amplifier (200) of claim 1, further comprising:

a third clamping circuit coupled between the gate terminal of the first NMOS cascode transistor ($M_{P2}$) and a power supply voltage and being driven by the first bias voltage, the third clamping circuit limiting the gate voltage of the first NMOS cascode transistor to be within a threshold voltage of the first bias voltage; and a fourth clamping circuit coupled between the gate terminal of the second NMOS cascode transistor ($M_{N2}$) and a power supply voltage and being driven by the first bias voltage, the fourth clamping circuit limiting the gate voltage of the second NMOS cascode transistor to be within a threshold voltage of the first bias voltage.

7. The gain-boosted telescopic amplifier of claim 6, wherein:

the third clamping circuit comprises a fifth NMOS transistor ($M_{CP4}$) having a drain terminal coupled to a positive power supply voltage, a source terminal coupled to the gate terminal of the first NMOS cascode transistor ($M_{P2}$) and a gate terminal coupled to the first bias voltage ($V_{CSN}$); and the fourth clamping circuit comprises a sixth NMOS transistor ($M_{CN4}$) having a drain terminal coupled to the positive power supply voltage, a source terminal coupled to the gate terminal of the second NMOS cascode transistor ($M_{N2}$) and a gate terminal coupled to the first bias voltage ($V_{CSN}$), wherein the third and fourth clamping circuits limit the gate voltage of the first and second NMOS cascode transistors to a voltage of $V_{CSN}+V_{THN}$, where $V_{CSN}$ denotes the first bias voltage and $V_{THN}$ denotes the threshold voltage of the NMOS transistors.

8. The gain-boosted telescopic amplifier of claim 6, wherein:

the third clamping circuit comprises a third PMOS transistor ($M_{CP3}$) having a drain terminal coupled to a negative power supply voltage, a source terminal coupled to the gate terminal of the first NMOS cascode transistor ($M_{P2}$) and a gate terminal coupled to the first bias voltage ($V_{CSN}$); and the fourth clamping circuit comprises a fourth PMOS transistor ($M_{CN3}$) having a drain terminal coupled to the negative power supply voltage, a source terminal coupled to the gate terminal of the second NMOS cascode transistor ($M_{N2}$) and a gate terminal coupled to the first bias voltage ($V_{CSN}$), wherein the third and fourth clamping circuits limit the gate voltage of the first and second NMOS cascode transistors to a voltage of $V_{CSN}-V_{THP}$, where $V_{CSN}$ denotes the first bias voltage and $V_{THP}$ denotes the threshold voltage of the PMOS transistors.

9. The gain-boosted telescopic amplifier of claim 7, wherein:

the third clamping circuit further comprises a third PMOS transistor ($M_{CP3}$) having a drain terminal coupled to a negative power supply voltage, a source terminal coupled to the gate terminal of the first NMOS cascode transistor ($M_{P2}$) and a gate terminal coupled to the first bias voltage ($V_{CSN}$); and the fourth clamping circuit further comprises a fourth PMOS transistor ($M_{CN3}$) having a drain terminal coupled to the negative power supply voltage, a source terminal coupled to the gate terminal of the second NMOS cascode transistor ($M_{N2}$) and a gate terminal coupled to the first bias voltage ($V_{CSN}$), wherein the third and fourth clamping circuits further limit the gate voltage of the first and second NMOS cascode transistors to a voltage of $V_{CSN}-V_{THP}$, where $V_{CSN}$ denotes the first bias voltage and $V_{THP}$ denotes the threshold voltage of the PMOS transistors.

10. The gain-boosted telescopic amplifier of claim 9, wherein the positive power supply voltage comprises a VDD voltage and the negative power supply voltage comprises a ground voltage.

11. The gain-boosted telescopic amplifier of claim 1, wherein the input pair comprises:

the first NMOS transistor ($M_{P1}$) having a drain terminal coupled to a source terminal of the first NMOS cascode transistor, a source terminal coupled to the tail current source, and a gate terminal receiving a first input signal ($V_{INP}$); and the second NMOS transistor ($M_{N1}$) having a drain terminal coupled to a source terminal of the second NMOS cascode transistor, a source terminal coupled to the tail current source, and a gate terminal receiving a second input signal ($V_{INN}$).

12. The gain-boosted telescopic amplifier of claim 1, wherein the first and second NMOS cascode transistors ($M_{P2}$, $M_{N2}$) and the gain-boosting feedback loop comprise:

the first NMOS cascode transistor ($M_{P2}$) having a source terminal coupled to the drain terminal of the first NMOS transistor ($M_{P1}$), a drain terminal being a first output node (102) and a gate terminal;

the second NMOS cascode transistor ($M_{N2}$) having a source terminal coupled to the drain terminal of the second NMOS transistor ($M_{N1}$), a drain terminal being a second output node and a gate terminal;

a first amplifier ($AMP_{P1}$) having an inverting input terminal coupled to the source terminal of the first NMOS cascode transistor, a non-inverting input terminal coupled to receive the first bias voltage ($V_{CSN}$), and an output terminal driving the gate terminal of the first NMOS cascode transistor; and a second amplifier ($AMP_{N1}$) having an inverting input terminal coupled to the source terminal of the second NMOS cascode transistor, a non-inverting input terminal coupled to receive the first bias voltage ($V_{CSN}$), and an output terminal driving the gate terminal of the second NMOS cascode transistor.

13. The gain-boosted telescopic amplifier of claim 1, wherein the first and second PMOS cascode transistors ($M_{P3}$, $M_{N3}$) and the gain-boosting feedback loop comprise:

the first PMOS cascode transistor ($M_{P3}$) having a source terminal coupled to a first bias current source (106), a drain terminal being the first output node (102) and a gate terminal;

the second PMOS cascode transistor ($M_{N3}$) having a source terminal coupled to a second bias current source (108), a drain terminal being the second output node and a gate terminal;

a third amplifier ($AMP_{P2}$) having an inverting input terminal coupled to the source terminal of the first PMOS cascode transistor, a non-inverting input terminal coupled to receive the second bias voltage ($V_{CSP}$), and an output terminal driving the gate terminal of the first PMOS cascode transistor; and a fourth amplifier ($AMP_{N2}$) having an inverting input terminal coupled to the source terminal of the second PMOS cascode transistor, a non-inverting input terminal coupled to receive the second bias voltage ($V_{CSP}$), and an output terminal driving the gate terminal of the second PMOS cascode transistor.

* * * * *